(12) United States Patent
Hioka et al.

(10) Patent No.: US 11,189,348 B2
(45) Date of Patent: Nov. 30, 2021

(54) SEMICONDUCTOR MEMORY DEVICE

(71) Applicant: KIOXIA CORPORATION, Tokyo (JP)

(72) Inventors: Takeshi Hioka, Machida Tokyo (JP); Naofumi Abiko, Kawasaki Kanagawa (JP); Masaki Unno, Fujisawa Kanagawa (JP)

(73) Assignee: KIOXIA CORPORATION, Tokyo (JP)

(*) Notice: Subject to any disclaimer, the term of this patent is extended or adjusted under 35 U.S.C. 154(b) by 0 days.

(21) Appl. No.: 17/009,389

(22) Filed: Sep. 1, 2020

(65) Prior Publication Data
US 2021/0174879 A1    Jun. 10, 2021

(30) Foreign Application Priority Data
Dec. 10, 2019   (JP) .............................. JP2019-222788

(51) Int. Cl.
| | | |
|---|---|---|
| *G11C 16/14* | (2006.01) | |
| *G11C 11/56* | (2006.01) | |
| *G11C 16/04* | (2006.01) | |
| *H01L 27/11582* | (2017.01) | |
| *H01L 27/11556* | (2017.01) | |

(52) U.S. Cl.
CPC .......... *G11C 16/14* (2013.01); *G11C 11/5635* (2013.01); *G11C 11/5671* (2013.01); *G11C 16/0483* (2013.01); *H01L 27/11556* (2013.01); *H01L 27/11582* (2013.01)

(58) Field of Classification Search
CPC .................................................... G11C 16/14
USPC ..................................................... 365/185.29
See application file for complete search history.

(56) References Cited

U.S. PATENT DOCUMENTS

| | | | | |
|---|---|---|---|---|
| 2010/0002515 | A1* | 1/2010 | Lutze ................. | G11C 16/3418 365/185.17 |
| 2012/0134210 | A1* | 5/2012 | Maeda ................... | G11C 16/08 365/185.11 |
| 2016/0284413 | A1* | 9/2016 | Chang ..................... | G11C 16/14 |
| 2018/0188958 | A1* | 7/2018 | Kim ........................ | G06F 3/061 |
| 2019/0378574 | A1* | 12/2019 | Lee ......................... | G11C 16/16 |
| 2020/0411105 | A1* | 12/2020 | Lee ..................... | G11C 16/0483 |

FOREIGN PATENT DOCUMENTS

JP       2017-152066 A     8/2017

* cited by examiner

*Primary Examiner* — Min Huang
(74) *Attorney, Agent, or Firm* — Kim & Stewart LLP (57) ABSTRACT

A semiconductor memory device includes a first memory cell, a first select transistor between the first memory cell and a source line, a second select transistor between the first memory cell and a bit line, a third select transistor between the source line and the bit line, and a control circuit. During an erase operation, the control circuit is configured to apply a first voltage to the source line, apply a second voltage lower than the first voltage to a gate of the third select transistor while applying the first voltage to the source line to cause a third voltage to be applied to the bit line, and apply a fourth voltage lower than the third voltage to the gate of the second select transistor while the third voltage is applied to the bit line.

20 Claims, 8 Drawing Sheets

SEMICONDUCTOR MEMORY DEVICE

CROSS-REFERENCE TO RELATED APPLICATION

This application is based upon and claims the benefit of priority from Japanese Patent Application No. 2019-222788, filed Dec. 10, 2019, the entire contents of which are incorporated herein by reference.

FIELD

Embodiments described herein relate generally to a semiconductor memory device.

BACKGROUND

A NAND flash memory is known as a semiconductor memory device.

DETAILED DESCRIPTION

Embodiments provide a semiconductor memory device capable of increasing the speed of an erase operation without an increase in the number of circuit elements.

In general, according to one embodiment, there is provided a semiconductor memory device including a source line, a bit line, a first memory cell, a first select transistor between the first memory cell and the source line, a second select transistor between the first memory cell and the bit line, a third select transistor disposed between the source line and the bit line and is different from the first select transistor, and a control circuit. The first select transistor and the third select transistor are connected to the source line, and the control circuit is configured to, during an erase operation on the first memory cell, apply a first voltage to the source line, apply a second voltage lower than the first voltage to a gate of the third select transistor while applying the first voltage to the source line to cause a third voltage to be applied to the bit line, and apply a fourth voltage lower than the third voltage to a gate of the second select transistor while the third voltage is applied to the bit line.

In the following, embodiments will be described with reference to the accompanying drawings. In the following description, elements having the same function and configuration are denoted by common reference numerals. When a plurality of elements having a common reference symbol are distinguished, the common reference symbols are distinguished by attaching subscripts. When it is not necessary to particularly distinguish between the plurality of elements, only a common reference numeral is attached to the plurality of elements, and no subscript is attached thereto.

First Embodiment

A semiconductor memory device 1 according to a first embodiment will be described below.

Configuration Example

1. Memory System

Figure 1:
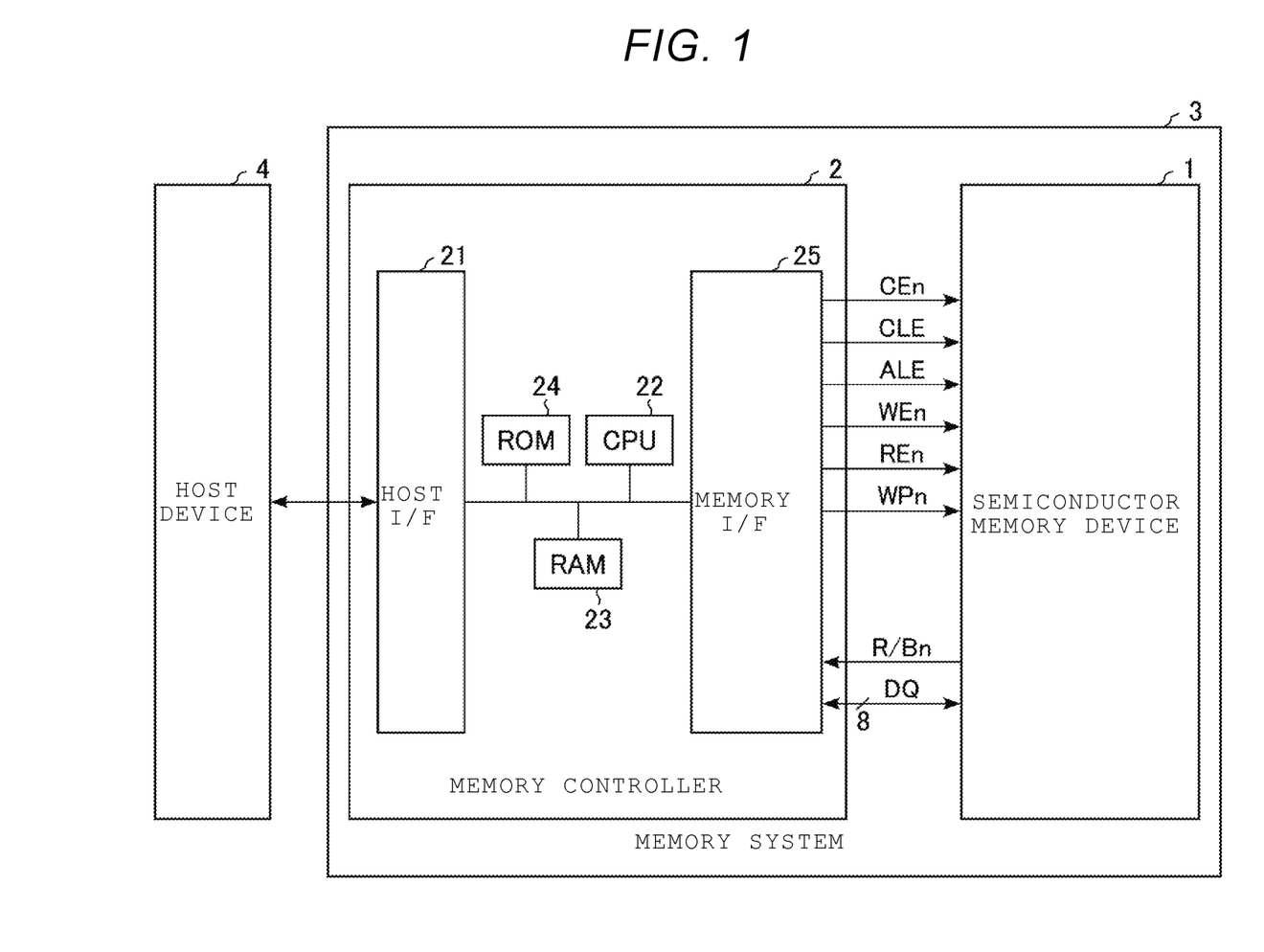
FIG. 1 is a block diagram illustrating an example of a configuration of a memory system including a semiconductor memory device according to a first embodiment.

FIG. 1 is a block diagram illustrating an example of a configuration of a memory system 3 including the semiconductor memory device 1 according to the first embodiment.

As illustrated in FIG. 1, the memory system 3 includes the semiconductor memory device 1 and a memory controller 2, and is controlled by a host device 4. The memory system 3 is, for example, a solid state drive (SSD), an SD™ card, or the like.

The semiconductor memory device 1 is controlled by the memory controller 2. The memory controller 2 receives an instruction from the host device 4 and controls the semiconductor memory device 1 based on the received instruction.

The memory controller 2 includes a host interface circuit 21, a central processing unit (CPU) 22, a random access memory (RAM) 23, a read only memory (ROM) 24, and a memory interface circuit (memory I/F) 25. The memory controller 2 is configured as, for example, a system-on-a-chip (SoC).

The ROM 24 stores firmware (program). The RAM 23 can store the firmware and is used as a work area for the CPU 22. The RAM 23 further temporarily stores data and functions as a buffer and a cache. The firmware stored in the ROM 24 and loaded onto the RAM 23 is executed by the CPU 22. With this configuration, the memory controller 2 executes various operations including a read operation, a write operation, an erase operation, and the like, and some of the functions of the host interface circuit 21 and the memory interface circuit 25.

The host interface circuit 21 is connected to the host device 4 via a host interface, and manages communication between the memory controller 2 and the host device 4. For example, the host interface circuit 21 receives an instruction from the host device 4. The memory interface circuit 25 is connected to the semiconductor memory device 1 via a memory interface, and manages communication between the memory controller 2 and the semiconductor memory device 1. For example, the memory interface circuit 25 issues a command sequence including a command and address information based on an instruction from the host device 4 and transmits the command sequence to the semiconductor memory device 1. The memory interface transmits, for example, a chip enable signal CEn, a command latch enable signal CLE, an address latch enable signal ALE, a write enable signal WEn, a read enable signal REn, a write protect signal WPn, a ready/busy signal R/Bn, and a signal DQ.

2. Semiconductor Memory Device

Figure 2:
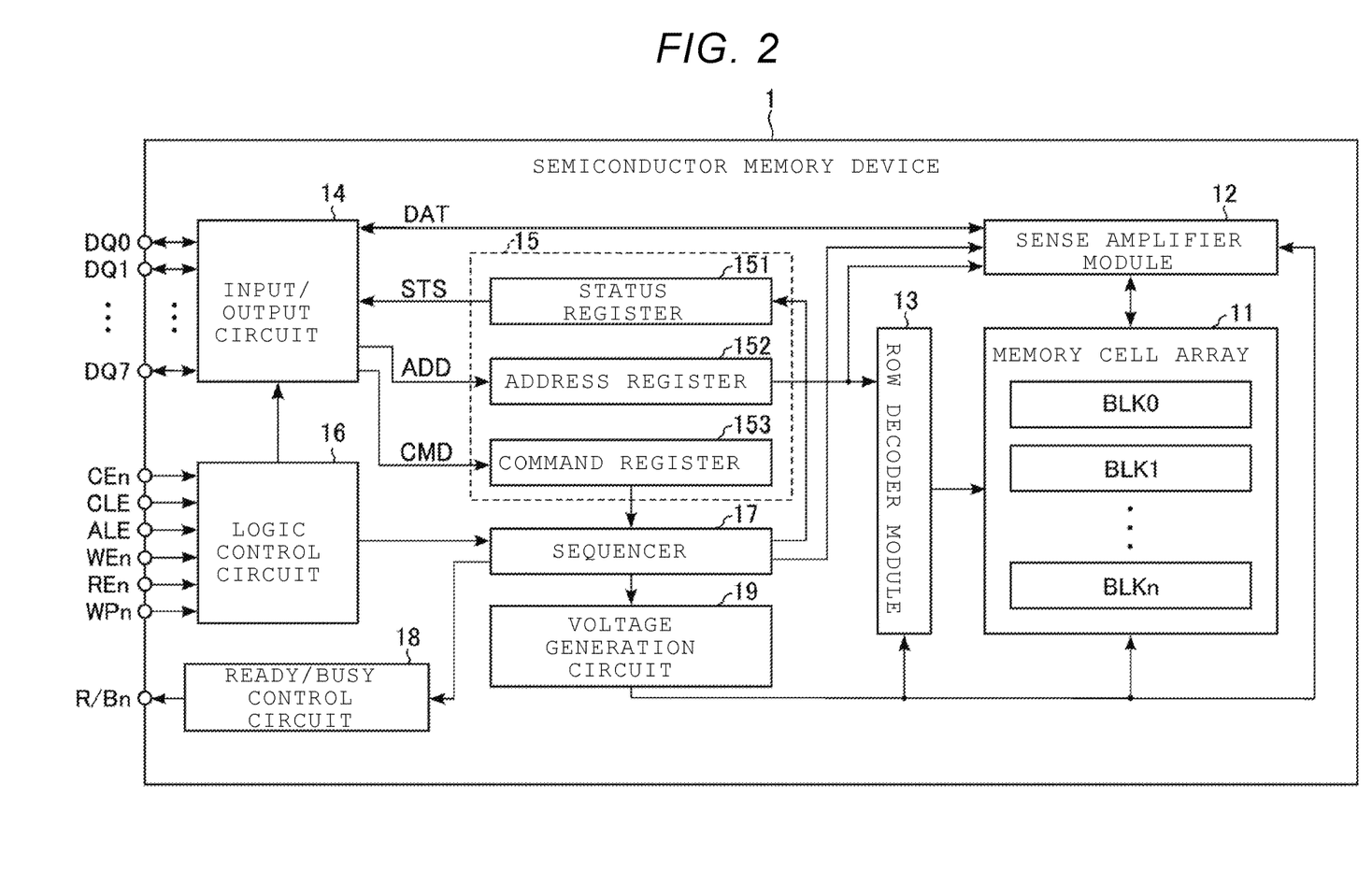
FIG. 2 is a block diagram illustrating an example of a configuration of the semiconductor memory device according to the first embodiment.

FIG. 2 is a block diagram illustrating an example of the configuration of the semiconductor memory device 1 according to the first embodiment. The semiconductor memory device 1 according to the first embodiment is, for example, a NAND flash memory capable of storing data in a nonvolatile manner.

The semiconductor memory device 1 includes a memory cell array 11 and peripheral circuits. The peripheral circuits include a sense amplifier module 12, a row decoder module 13, an input/output circuit 14, a register 15, a logic control circuit 16, a sequencer 17, a ready/busy control circuit 18, and a voltage generation circuit 19. In the semiconductor memory device 1, various operations such as a write operation for storing write data DAT in the memory cell array 11, a read operation for reading read data DAT from the memory cell array 11, and an erase operation for erasing data stored in the memory cell array 11 are executed.

The memory cell array 11 includes blocks BLK0 to BLKn (n is an integer of 1 or more). A block BLK includes a plurality of nonvolatile memory cells associated with bit lines and word lines, and serves as a data erase unit, for example. In the semiconductor memory device 1, for example, a single-level cell (SLC) method or a multi-level cell (MLC) method is applicable. In the SLC method, 1-bit data is stored in each memory cell, and in the MLC method, 2-bit data is stored in each memory cell. Data of three bits or more also may be stored in each memory cell.

The input/output circuit 14 controls input and output of the signal DQ with the memory controller 2. The signal DQ may contain a command CMD, data DAT, address information ADD, status information STS, and the like. The command CMD includes, for example, an instruction for executing an instruction from the host device 4. The data DAT includes write data DAT or read data DAT. The address information ADD includes, for example, a column address and a row address. The status information STS includes information on a status of the semiconductor memory device 1, for example, the results of the write operation, the read operation, and the erase operation.

More specifically, the input/output circuit 14 includes an input circuit and an output circuit, and the input circuit and the output circuit perform a process described below. The input circuit receives the write data DAT, the address information ADD, and the command CMD from the memory controller 2. The input circuit transfers the received write data DAT to the sense amplifier module 12 and transfers the received address information ADD and command CMD to the register 15. The output circuit receives the status information STS from the register 15 and receives the read data DAT from the sense amplifier module 12. The output circuit transmits the received status information STS and read data DAT to the memory controller 2. The output circuit may transmit the received status information STS and read data DAT together to the memory controller 2. Here, the input/output circuit 14 and the sense amplifier module 12 are connected via a data bus. The data bus includes, for example, eight data lines IO0 to IO7 corresponding to signals DQ0 to DQ7, respectively. The number of data lines IO is not limited to 8, and may be, for example, 16 or 32 lines, and the number of data lines IO may be set to any number.

The register 15 includes a status register 151, an address register 152, and a command register 153.

The status register 151 stores the status information STS and transfers the status information STS to the input/output circuit 14 based on the instruction of the sequencer 17.

The address register 152 stores the address information ADD transferred from the input/output circuit 14, and transfers the address information ADD to the sequencer 17. The address register 152 transfers the column address in the address information ADD to the sense amplifier module 12, and transfers the row address in the address information ADD to the row decoder module 13.

The command register 153 stores the command CMD transferred from the input/output circuit 14, and transfers the command CMD to the sequencer 17.

The logic control circuit 16 receives, for example, the chip enable signal CEn, the command latch enable signal CLE, the address latch enable signal ALE, the write enable signal WEn, the read enable signal REn, and the write protect signal WPn, from the memory controller 2. The logic control circuit 16 controls the input/output circuit 14 and the sequencer 17 based on the received signal.

The chip enable signal CEn is a signal used for enabling the semiconductor memory device 1. The command latch enable signal CLE is a signal used to notify the input/output circuit 14 that the signal DQ input to the semiconductor memory device 1 contains the command CMD. The address latch enable signal ALE is a signal used to notify the input/output circuit 14 that the signal DQ input to the semiconductor memory device 1 contains the address information ADD. Each of the write enable signal WEn and the read enable signal REn is a signal used for instructing the input/output circuit 14 to input and output the signal DQ, for example. The write protect signal WPn is a signal used to instruct the semiconductor memory device 1 to prohibit writing of data and erasing of data.

The sequencer 17 receives the command CMD and the address information ADD, and controls the operation of the entire semiconductor memory device 1 according to the received command CMD and the address information ADD. For example, the sequencer 17 controls the sense amplifier module 12, the row decoder module 13, the voltage generation circuit 19, and the like to execute various operations such as a write operation, a read operation, and an erase operation.

The ready/busy control circuit 18 generates a ready/busy signal R/Bn according to control by the sequencer 17 and transmits the generated ready/busy signal R/Bn to the memory controller 2. The ready/busy signal R/Bn is a signal used to notify whether the semiconductor memory device 1 is in a ready state, that is, is ready to receive an instruction from the memory controller 2 or in a busy state, that is, is not ready to receive an instruction.

The voltage generation circuit 19 generates various voltages under the control of the sequencer 17, and supplies the generated voltages to the memory cell array 11, the sense amplifier module 12, the row decoder module 13, and the like.

The sense amplifier module 12 receives the column address from the address register 152 and decodes the received column address. The sense amplifier module 12 executes a transfer operation of data DAT between the memory controller 2 and the memory cell array 11 based on the decoding result. That is, the sense amplifier module 12 senses the threshold voltage of the memory cell transistor in the memory cell array 11 to generate the read data DAT, and outputs the generated read data DAT to the memory controller 2 via the input/output circuit 14. The sense amplifier module 12 also receives write data DAT from the memory controller 2 via the input/output circuit 14, and transfers the received write data DAT to the memory cell array 11.

The row decoder module 13 receives a row address from the address register 152 and decodes the received row address. The row decoder module 13 selects the block BLK targeted for execution of various operations based on the decoding result. The row decoder module 13 can transfer a voltage supplied from the voltage generation circuit 19 to the selected block BLK.

3. Memory Cell Array

Figure 3:
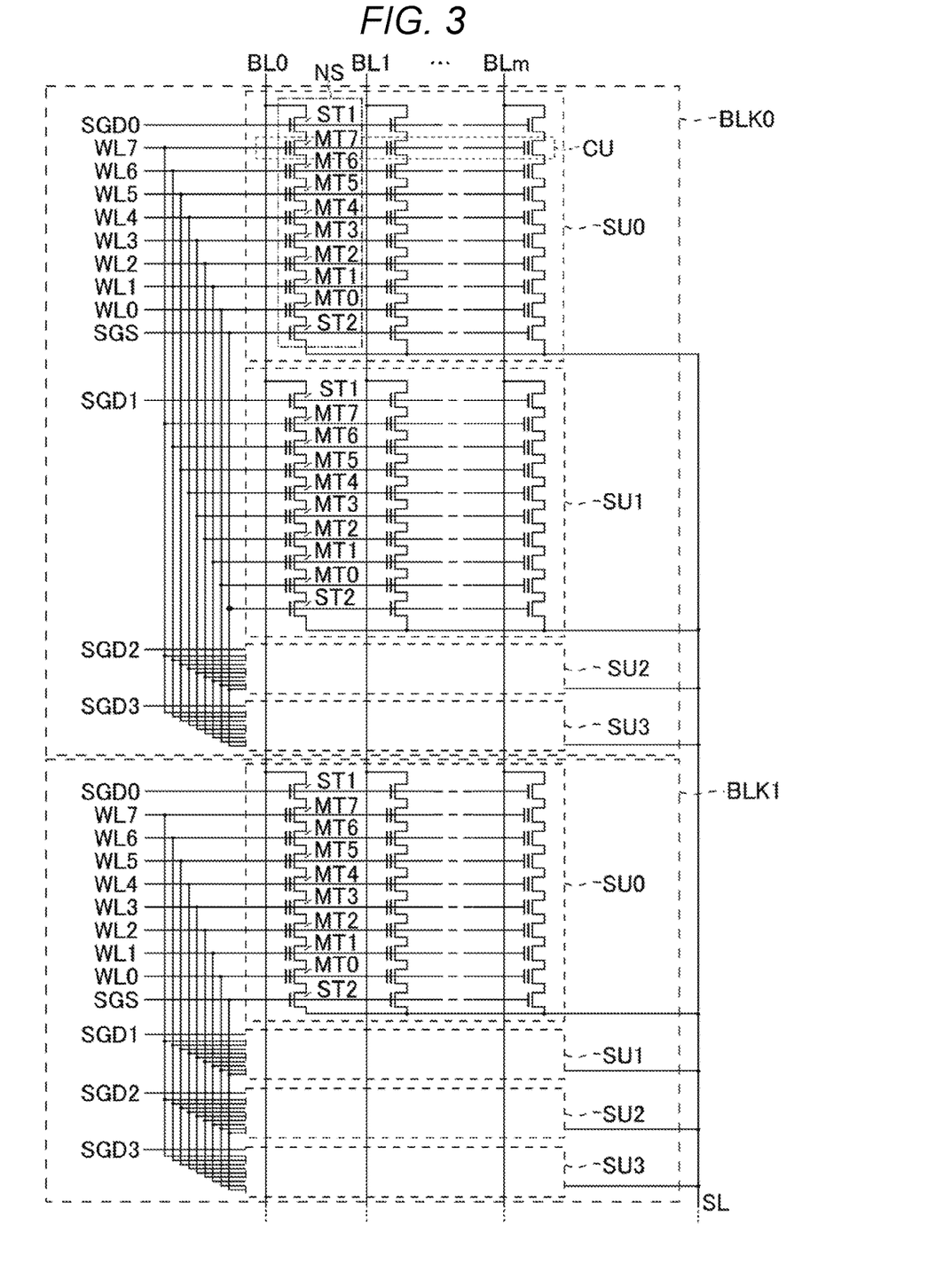
FIG. 3 is a diagram illustrating an example of a circuit configuration of a memory cell array in the semiconductor memory device according to the first embodiment.

FIG. 3 illustrates an example of a circuit configuration of the memory cell array 11 in the semiconductor memory device 1 according to the first embodiment. As an example of the circuit configuration of the memory cell array 11, an example of the circuit configuration of the blocks BLK0 and BLK1 among the plurality of blocks BLK in the memory cell array 11 is illustrated. The block BLK0 and the block BLK1 have equivalent circuit configurations. For example, the other blocks BLK in the memory cell array 11 also have the same circuit configuration as the blocks BLK0 and BLK1.

As illustrated in FIG. 3, each block BLK includes, for example, four string units SU0 to SU3. Each string unit SU includes a plurality of NAND strings NS. Each NAND string NS is connected to a corresponding bit line BL of the bit lines BL0 to BLm (m is an integer of 1 or more), and includes, for example, memory cell transistors MT0 to MT7 and select transistors ST1 and ST2. Each memory cell transistor MT includes a control gate (hereinafter, also referred to as a gate) and a charge storage layer, and stores data in a nonvolatile manner. Each of the select transistors ST1 and ST2 is used to select the NAND string NS including the select transistors ST1 and ST2 during various operations.

A drain of the select transistor ST1 of each NAND string NS is connected to the corresponding bit line BL. The memory cell transistors MT0 to MT7 are connected in series between a source of the select transistor ST1 and a drain of the select transistor ST2. A source of the select transistor ST2 is connected to a source line SL.

The gates of the respective select transistors ST1 of the NAND strings NS in the same string unit SUj of the same block BLK are commonly connected to a select gate line SGDj. Here, in the example of FIG. 3, j is an integer from 0 to 3. The gates of the respective select transistors ST2 of the NAND strings NS in the same block BLK are commonly connected to a select gate line SGS. The gates of the respective memory cell transistors MTk of the NAND strings NS in the same block BLK are commonly connected to a word line WLk. Here, in the example of FIG. 3, k is any integer from 0 to 7. For example, across the different blocks BLK, different wirings that are not electrically connected are used as wirings of the select gate lines SGD and SGS and the word line WL.

Each bit line BL is commonly connected to the drains of the select transistors ST1 of the corresponding NAND strings NS in the string units SU of the same block BLK. Each bit line BL is shared across the blocks BLK and has similar connections in the different blocks BLK.

The source line SL is shared between the string units SU of the block BLK by being commonly connected to the sources of the respective select transistors ST2 of the NAND strings NS in the same block BLK. The source line SL is shared across the blocks BLK and has similar connections in the different blocks BLK.

A set of memory cell transistors MT commonly connected to a certain word line WL in one string unit SU is called, for example, a cell unit CU. For example, a set of 1-bit data of the same bit position stored in each of the memory cell transistors MT in the cell unit CU is called, for example, "one page data".

Although the circuit configuration of the memory cell array 11 is described as above, the circuit configuration of the memory cell array 11 is not limited thereto. For example, the number of string units SU in each block BLK may be set to any positive number. The numbers of the memory cell transistors MT and the select transistors ST1 and ST2 in each NAND string NS may be set to any positive number. Each of the number of word lines WL and select gate lines SGD and SGS is changed based on the number of memory cell transistors MT and select transistors ST1 and ST2 in the NAND string NS.

4. Cross-Sectional Structure of Semiconductor Memory Device

Figure 4:
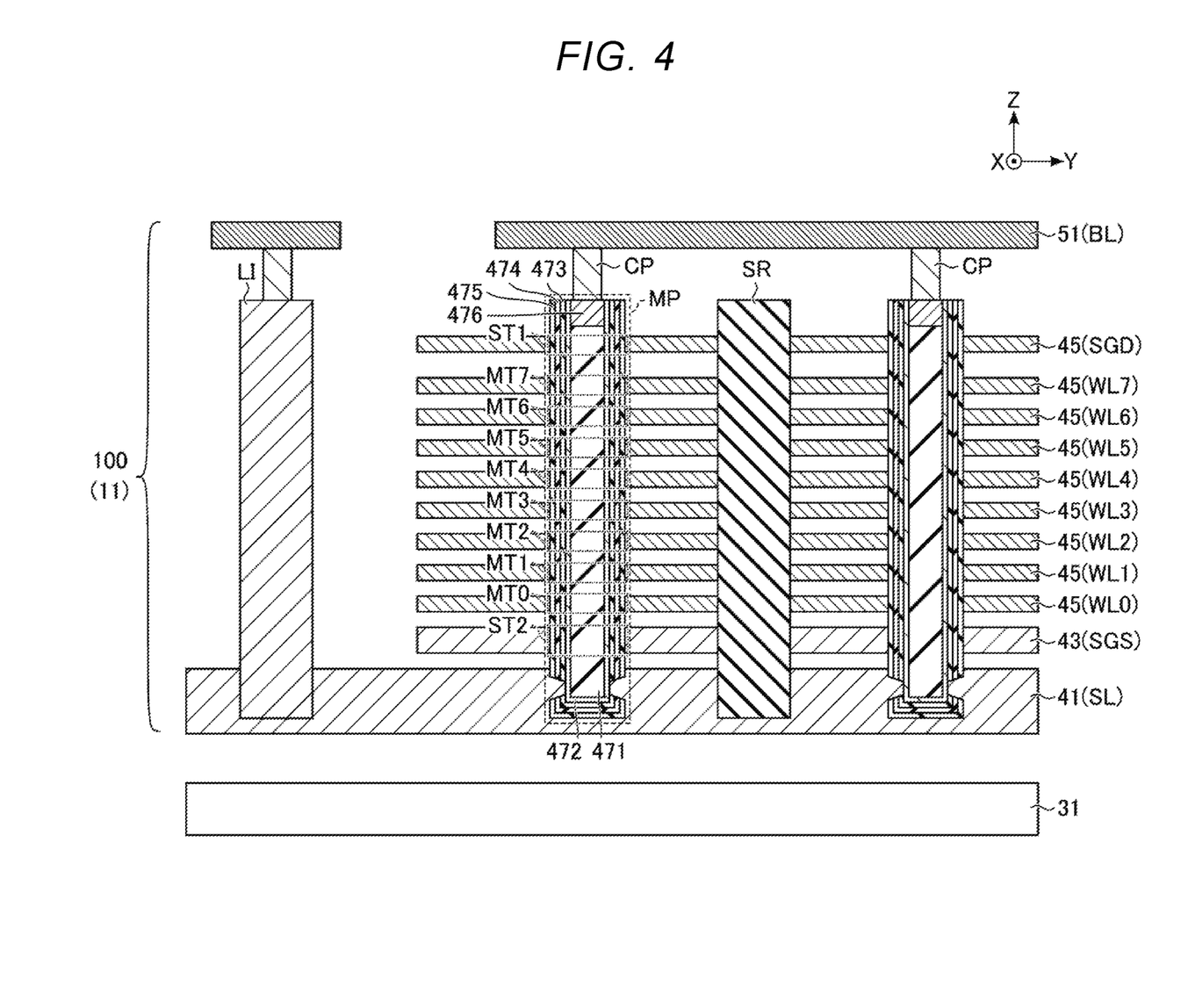
FIG. 4 is a cross-sectional view illustrating an example of a cross-sectional structure of the semiconductor memory device according to the first embodiment.

FIG. 4 is a cross-sectional view illustrating an example of a cross-sectional structure of the semiconductor memory device 1 according to the first embodiment. In the example of FIG. 4, an interlayer insulator is omitted. The cross-sectional structure illustrated in FIG. 4 is merely an example, and the cross-sectional structure of the semiconductor memory device 1 is not limited to the illustrated one.

The semiconductor memory device 1 includes a semiconductor substrate 31. Here, two directions that are parallel to the surface of the semiconductor substrate 31 and are, for example, orthogonal to each other are defined as an x-direction and a y-direction, and a direction which is orthogonal to the surface of the semiconductor substrate 31 and in which the memory cell array 11 is formed is defined as a z-direction. In the following description, although description will be made by setting the z-direction as "upper" and the direction opposite to the z-direction as "lower", this notation is for convenience only and is independent of, for example, the direction of gravity.

The semiconductor memory device 1 includes a memory cell section 100 provided above the semiconductor substrate 31. The memory cell array 11 is provided in the memory cell section 100. Specifically, in the memory cell section 100, the memory cell transistors MT illustrated in FIG. 3 are three-dimensionally arranged. A part of the structure of the memory cell array 11 is configured with a stacked body including a conductor 43 and conductors 45, and a memory pillar MP in the stacked body. Between the semiconductor substrate 31 and the memory cell section 100, for example, the circuit elements forming the peripheral circuit illustrated in FIG. 2 are provided.

The structure of the memory cell section 100 will be described in detail below.

A conductor 41 is provided above the semiconductor substrate 31. The conductor 41 includes, for example, polysilicon (Si) doped with N-type impurities such as phosphorus, or metal. The conductor 41 functions as the source line SL. The conductor 43 is provided above the conductor 41 via an insulator. The conductor 43 functions as the select gate line SGS.

In the example of FIG. 4, nine layers of conductors 45 are sequentially stacked above the conductor 43 with an insulator interposed between the conductors. The conductors 45 function as, for example, a word line WL0, a word line WL1, a word line WL2, ..., a word line WL7, and the select gate line SGD in order from the side closer to the semiconductor substrate 31.

The memory pillar MP is provided in the conductors 45, the conductor 43, and the conductor 41. One memory pillar MP corresponds to a region where the memory cell transistors MT0 to MT7 and the select transistors ST1 and ST2 in one NAND string NS are located. The memory pillar MP extends in the z-direction, for example. For example, the upper end of the memory pillar MP is located above the upper surface of the uppermost conductor 45, and the lower end of the memory pillar MP is located below the upper surface of the conductor 41.

The memory pillar MP includes, for example, a core portion 471, a semiconductor 472, a tunnel oxide film 473, an insulating film 474, a block insulating film 475, and a semiconductor 476. The upper end of the pillar-shaped core portion 471 is located above the upper surface of the uppermost conductor 45, and the lower end of the core portion 471 is located below the upper surface of the conductor 41. The side surface and the lower surface of the core portion 471 are covered with the semiconductor 472. The upper surface of the semiconductor 472 is located above the upper surface of the core portion 471. A region of the side surface of the semiconductor 472 between the upper surface and the lower surface of the conductor 41 contacts the conductor 41. The tunnel oxide film 473, the insulating film 474, and the block insulating film 475 are provided on the side surface and the lower surface of the semiconductor 472 excluding the region contacting the conductor 41, in order of the tunnel oxide film 473, the insulating film 474, and the block insulating film 475. The semiconductor 476 is provided on the upper surface of the core portion 471. The side surface of the semiconductor 476 is covered with the semiconductor 472. The semiconductor 472 functions as a channel of the memory cell transistor MT and the select transistor ST. The insulating film 474 functions as a charge storage layer. A portion of the memory pillar MP that intersects the conductor 43 functions as, for example, the select transistor ST2. The portions of the memory pillars MP that intersect with the conductors 45 function as, for example, the memory cell transistor MT0, the memory cell transistor MT1, . . . , the memory cell transistor MT7, and the select transistor ST1 in order from the side closer to the semiconductor substrate 31.

Pillar-shaped contact plugs CP are provided on the upper surfaces of the semiconductors 472 and 476. The upper surface of each contact plug CP is in contact with one conductor 51 in the layer in which the bit line is provided. The conductor 51 functions as the bit line BL. The conductor 51 extends in the y-direction, for example. A plurality of conductors 51 are provided, for example, at common intervals along the x-direction.

A dividing region SR is provided in the conductor 45, the conductors 43, and the conductor 41. The dividing region SR extends in a plate shape on the xz-plane corresponding to the x-direction and the z-direction, for example. The upper end of the dividing region SR is located above the upper surface of the uppermost conductor 45, and the lower end of the dividing region SR is located below the upper surface of the conductor 41 and above the lower surface of the conductor 41. The conductors 45 and the conductor 43 are divided by the dividing region SR. A plurality of dividing regions SR are provided, for example, at common intervals along the y-direction. For example, one block BLK is provided between the adjacent dividing regions SR. As illustrated in FIG. 4, the memory pillars MP of different blocks BLK are commonly connected to the same conductor 51. With this configuration, the bit line BL is shared between the blocks BLK. On the other hand, the conductor 41 is not divided by the dividing region SR. With this configuration, the source line SL is shared between the blocks BLK.

A conductor LI is provided on the conductor 41. The conductor LI extends in a plate shape in the xz-plane corresponding to the x-direction and the z-direction, for example. The conductor LI functions as a source line contact.

5. Memory Cell Transistor Threshold Voltage Distribution

Figure 5:
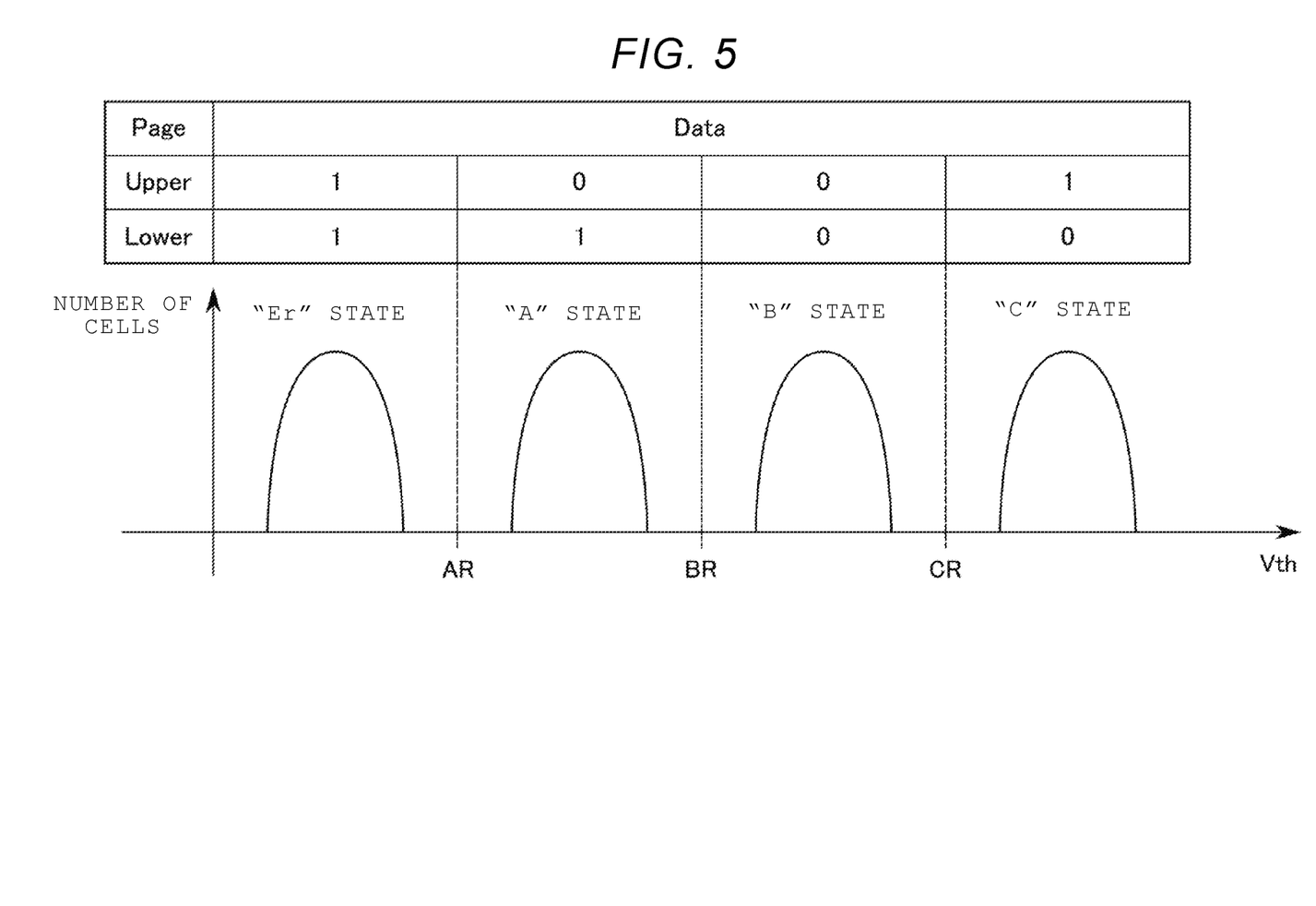
FIG. 5 is a diagram illustrating an example of a threshold voltage distribution formed by memory cell transistors of the semiconductor memory device according to the first embodiment.

FIG. 5 illustrates an example of a threshold voltage distribution, data allocation, and read voltage when each memory cell transistor MT in the memory cell array 11 illustrated in FIG. 3 stores 2-bit data.

The memory cell transistor MT stores the 2-bit data based on a voltage difference (hereinafter referred to as a threshold voltage) between the gate and the source that enables the memory cell transistor MT to be switched from an OFF state to an ON state. In the write operation, a program operation is performed in which electrons are injected into the charge storage layer of the memory cell transistor MT to increase the threshold voltage of the memory cell transistor MT.

FIG. 5 illustrates four threshold voltage distributions formed as a result of such control of the threshold voltage. In the threshold voltage distribution illustrated in FIG. 5, the vertical axis corresponds to the number of memory cell transistors MT, and the horizontal axis corresponds to a threshold voltage Vth of the memory cell transistors MT. On the horizontal axis, as an example, the lowest voltage applied to the gate of the memory cell transistor MT, which enables the memory cell transistor MT to be switched from the OFF state to the ON state when the reference voltage VSS is applied to the source of the memory cell transistor MT, is illustrated.

For example, depending on which of the four threshold voltage distributions the threshold voltage of the memory cell transistor MT is in, the memory cell transistor MT is distinguished as being in any of an "Er" state, an "A" state, a "B" state, and a "C" state. The threshold voltage of the memory cell transistor MT increases in the order of the "Er" state, the "A" state, the "B" state, and the "C" state. For example, "11" ("upper bit/lower bit") data is allocated to the "Er" state, "01" data is allocated to the "A" state, "00" data is allocated to the "B" state, and "10" data is allocated to the "C" state. Data allocated to each state represents the data stored in the memory cell transistor MT in that state.

In the read operation, it is determined which state the memory cell transistor MT is in. The read voltage used in the read operation is set. Specifically, a read voltage AR is set corresponding to the "A" state, a read voltage BR is set corresponding to the "B" state, and a read voltage CR is set corresponding to the "C" state.

The erase operation is an operation in which electrons are removed from the charge storage layer of the memory cell transistor MT, so that the threshold voltage of the memory cell transistor MT is lowered and it is included in the threshold voltage distribution of the "Er" state.

In the erase operation, an erase verify operation for confirming whether or not the threshold voltage of the memory cell transistor MT is lower than a predetermined voltage is also performed. An erase verify voltage (not illustrated) used in the erase verify operation is set. The erase verify voltage is set to be always higher than the threshold voltage of the memory cell transistor MT in the "Er" state and lower than the read voltage AR, for example.

The number of bits of data stored in one memory cell transistor MT and allocation of data to the threshold voltage distribution described above are merely examples, and the embodiment is not limited thereto.

6. Sense Amplifier Module

Figure 6:
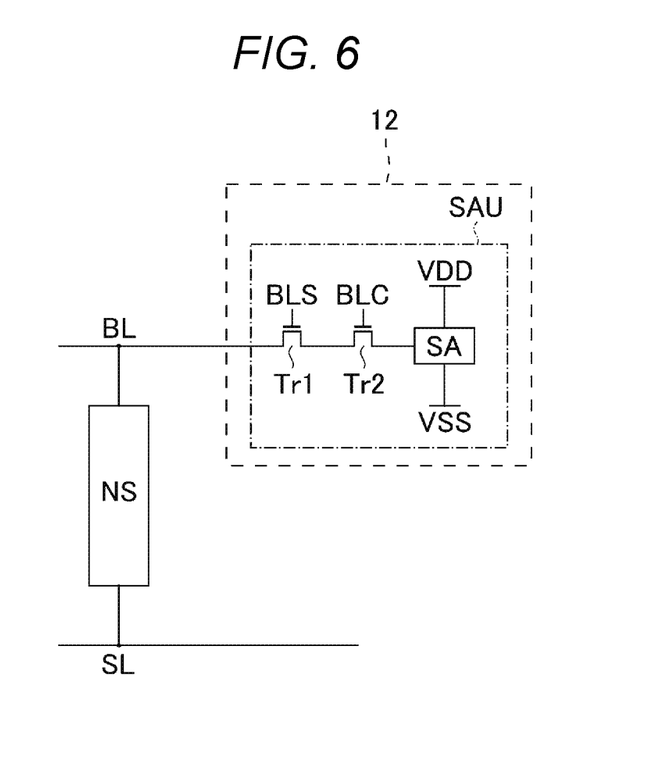
FIG. 6 is a diagram illustrating an example of a circuit configuration of a sense amplifier module of the semiconductor memory device according to the first embodiment.

FIG. 6 illustrates an example of a part of a circuit configuration of the sense amplifier module 12 of the semiconductor memory device 1 according to the first embodiment. The configuration of the sense amplifier module 12 described in detail below is merely an example, and various configurations are applicable as the sense amplifier module 12. In the following description, the memory cell transistor MT targeted for write or read is referred to as a selected memory cell transistor MT.

The sense amplifier module 12 includes, for example, a sense amplifier unit SAU provided for each bit line BL. A configuration of the sense amplifier unit SAU connected to a certain bit line BL will be described below as an example. For example, the sense amplifier unit SAU connected to another bit line BL has the same configuration.

The sense amplifier unit SAU includes, for example, n-channel MOS transistors Tr1 and Tr2 and a sense amplifier circuit SA.

A first terminal of the transistor Tr1 is connected to the bit line BL, and a second terminal of the transistor Tr1 is connected to a first terminal of the transistor Tr2. A control signal BLS is applied to a gate of the transistor Tr1. A second terminal of the transistor Tr2 is connected to the sense amplifier circuit SA, and a control signal BLC is applied to a gate of the transistor Tr2. The transistor Tr1 can control the electrical connection between the bit line BL and the sense amplifier circuit SA. The transistor Tr2 enables the bit line BL to be clamped to a voltage according to the control signal BLC. The control signals BLS and BLC are supplied by the sequencer 17, for example.

A voltage VDD is applied to a certain terminal of the sense amplifier circuit SA, and a voltage VSS is applied to another terminal of the sense amplifier circuit SA. The sense amplifier circuit SA enables transfer of these voltages to the bit line BL. With this configuration, in the read operation and the write operation, the sense amplifier circuit SA can operate as described below.

In the read operation, the sense amplifier circuit SA senses the threshold voltage of the selected memory cell transistor MT electrically connected to the bit line BL based on the current flowing through the bit line BL or the voltage of the bit line BL. With this configuration, the sense amplifier circuit SA reads the data stored in the selected memory cell transistor MT. The sense amplifier circuit SA can transmit the read data to the input/output circuit 14.

In the write operation, the sense amplifier circuit SA receives data from the input/output circuit 14. The sense amplifier circuit SA applies a voltage based on the received data to the bit line BL. With this configuration, the threshold voltage of the selected memory cell transistor MT electrically connected to the bit line BL is raised, for example, and data can be stored in the selected memory cell transistor MT.

Operation Example

The erase operation executed in the semiconductor memory device 1 according to the first embodiment will be described. For the sake of brevity, description of the erase verify operation of the erase operation will be omitted below.

1. Outline of GIDL Erase Operation

In the erase operation, the semiconductor memory device 1 generates a gate-induced drain leakage (GIDL) current in each of the select transistors ST1 and ST2 of the block BLK targeted for the erase operation. In the following, although the control relating to the select transistors ST1 and ST2 of the memory pillar MP will be described by taking a certain memory pillar MP of the block BLK targeted for the erase operation as an example, the same applies to the other memory pillars MP of the block BLK.

For example, when the voltage of the source line SL is higher than the voltage of the gate of the select transistor ST2 by a voltage difference $\Delta V\alpha$ or more, a GIDL current (hereinafter, also referred to as SL-side GIDL current) is generated. The electrons corresponding to the SL-side GIDL current move to the source line SL side, and holes generated due to the SL-side GIDL current are supplied into the memory pillar MP. Similarly, when the voltage of the corresponding bit line BL is higher than the voltage of the gate of the select transistor ST1 by a voltage difference $\Delta V\beta$ or more, a GIDL current (hereinafter, also referred to as a BL-side GIDL current) is generated. The electrons corresponding to the BL-side GIDL current move to the bit line BL side, and holes generated due to the BL-side GIDL current are supplied into the memory pillar MP. In order to generate these GIDL currents, for example, it is preferable to dope a region serving as the drain of the select transistor ST1 and/or ST2 with N-type impurities. The voltage difference between the source line SL and the gate of the select transistor ST2 and the voltage difference between the bit line BL and the gate of the select transistor ST1 when generating these GIDL currents are preferably less than a voltage difference $\Delta V gth$ for the purpose of preventing destruction of the select transistors ST1 and ST2, for example. The voltage difference $\Delta V gth$ is larger than the voltage differences $\Delta V\alpha$ and $\Delta V\beta$.

The semiconductor memory device 1 uses this principle to generate the GIDL current. The holes supplied into the memory pillar MP combine with the electrons in the charge storage layer of the memory cell transistor MT of the memory pillar MP. With this configuration, the threshold voltage of the memory cell transistor MT is lowered and included in the threshold voltage distribution of the "Er" state.

2. Examples of Various Voltages Used in GIDL Erase Operation

Figure 7:
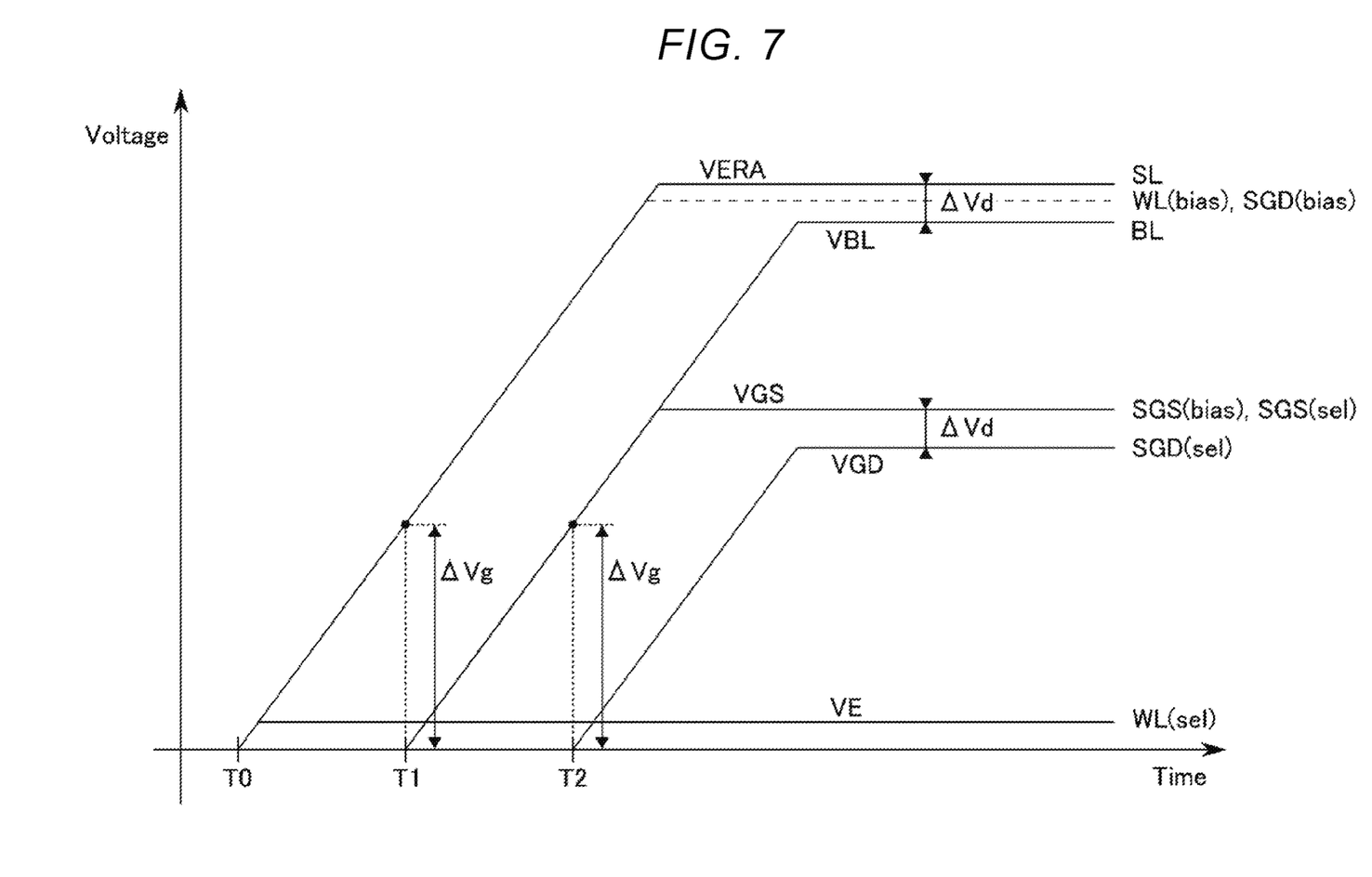
FIG. 7 is a timing chart illustrating an example of voltages applied to various wirings during an erase operation in the semiconductor memory device according to the first embodiment.

FIG. 7 is a timing chart illustrating an example of voltages applied to various wirings during the erase operation in the semiconductor memory device 1 according to the first embodiment. The erase operation described in detail below is merely an example, and the erase operation according to this embodiment is not limited thereto. In the following, when a voltage applied to a certain wiring is described, it is assumed that the application of the voltage to the wiring is continued unless it is explicitly described that another voltage is applied to the wiring after the application of the voltage or the wiring is brought into a floating state.

In FIG. 7, the changes in the voltages applied to the wirings of the block BLK targeted for the erase operation with respect to time, is illustrated. In the following, the block BLK targeted for the erase operation is referred to as a selected block BLK (sel). The word line WL and the select gate lines SGS and SGD of the selected block BLK (sel) are referred to as a word line WL (sel) and select gate lines SGS (sel) and SGD (sel), respectively. In FIG. 7, the changes in the voltage applied to each of one word line WL (sel) and one select gate line SGD (sel) corresponding to the memory pillar MP described as an example of the selected block BLK (sel) with respect to time, is illustrated. In the following, although the control of the voltage applied to each of the word line WL (sel) and the select gate line SGD (sel) will be described, the voltages applied to the other word lines WL (sel) and select gate lines SGD (sel) are also similarly controlled.

In FIG. 7, an example of the changes in the voltage applied to a wiring of a certain block BLK different from the selected block BLK (sel) with respect to time, is also illustrated. In the following, the block BLK will be referred to as a bias block BLK (bias) for the sake of simplicity of description. The word line WL and the select gate lines SGS and SGD of the bias block BLK (bias) are referred to as a word line WL (bias) and select gate lines SGS (bias) and SGD (bias), respectively. In FIG. 7, the changes in the voltage applied to each of one word line WL (bias) and one select gate line SGD (bias) corresponding to the memory pillar MP described as an example of the bias blocks BLK (bias) with respect to time, is illustrated. In the following, although the control of the voltage applied to each of the word line WL (bias) and the select gate line SGD (bias) will be described, the voltages applied to the other word lines WL (bias) and the select gate lines SGD (bias) are also similarly controlled. In the following, although the description related to the control relating to generation of the GIDL current in the memory pillar MP will be made by taking one memory pillar MP of the bias block BLK (bias) as an example, the same applies to the other memory pillars MP in the block BLK (bias).

The row decoder module 13 selects a block BLK to be used as the bias block BLK (bias) under the control of the sequencer 17. The selection of the bias block BLK (bias) may be based on the selected block BLK targeted for the erase operation. Alternatively, the block BLK to be used as the bias block BLK (bias) may be set in the semiconductor memory device 1 in advance. In this case, for example, in a plane including a plurality of blocks BLK that are sequentially adjacent to each other along a certain direction, the block BLK located at the end may be set as the bias block BLK (sel).

The row decoder module 13 can transfer the voltage supplied from the voltage generation circuit 19 to the bias block BLK (bias). The block BLK that can be used as the bias block BLK (bias) is not used, for example, as a region in which data is stored. That is, each of the memory cell transistors MT in the bias block BLK (bias) has a threshold voltage included in the threshold voltage distribution of the "Er" state. Alternatively, the block BLK that can be used as the bias block BLK (bias) may be used as a region in which data is stored.

As described above, each of the bit lines BL and the source line SL are shared between the selected block BLK (sel) and the bias block BLK (bias). It is assumed that the two memory pillars MP described by way of example are connected to the same bit line BL. In FIG. 7, the changes in the voltage applied to each of the one bit line BL and the source line SL corresponding to the two memory pillars with respect to time, is illustrated. Although the control of the voltage applied to the bit line BL will be described below, the voltages applied to the other bit lines BL of these bit lines BL are also similarly controlled.

The application of the voltage to the word line WL and the select gate lines SGS and SGD is executed by the control of the voltage generation circuit 19 and the row decoder module 13 by the sequencer 17, for example. The application of the voltage to the source line SL is executed by the control of the voltage generation circuit 19 by the sequencer 17, for example. The application of the voltage to the bit line BL is executed by the control of the voltage generation circuit 19 and the sense amplifier module 12 by the sequencer 17, for example.

In the example of FIG. 7, before the start of the erase operation, the voltage VSS is applied to each of the word lines WL (sel) and WL (bias), the select gate lines SGS (sel), SGD (sel), SGS (bias), and SGD (bias), the bit line BL, and the source line SL.

At time T0, the voltage applied to the source line SL is boosted to a voltage VERA, and a voltage VE is applied to the word line WL (sel). The voltage VE is a selection voltage applied to the gate of the memory cell transistor MT of the selected block BLK (sel). Although the voltage VE is illustrated as being higher than a voltage VSS in FIG. 7, the voltage VE is not limited thereto, and may be less than or equal to the voltage VSS, for example. The voltage VERA is higher than the voltage VE.

At time T0, the word line WL (bias) and the select gate line SGD (bias) are brought into a floating state. According to the boosting of the voltage applied to the source line SL, the voltage applied to each of the word line WL (bias) and the select gate line SGD (bias) in the floating state is boosted. This is because there is capacitive coupling between each of the word line WL (bias) and the select gate line SGD (bias) and the conductor LI connected to the source line SL. For example, the voltage of each of the word line WL (bias) and the select gate line SGD (bias) rises to near the voltage of the source line SL. The timing at which the word line WL (bias) and the select gate line SGD (bias) are brought into the floating state is not limited to time T0, and may be before or after time T0.

Under the situation where a voltage is applied to each wiring as described above, in both the bias block BLK (bias) and the selected block BLK (sel), the select transistor ST2 is in the OFF state, and electrons do not flow from the source line SL into the memory pillar MP.

After that, at time T1, the voltage applied to the select gate line SGS (bias) is boosted to a voltage VGS. The voltage VGS is higher than the voltage VE. The time T1 is a time when the voltage of the source line SL is higher than the voltage of the select gate line SGS (bias) to which the voltage VSS is applied by a voltage difference $\Delta Vg$ in the process during which the voltage is applied and the voltage of the source line SL rises as described above. For example, the voltage difference $\Delta Vg$ is greater than or equal to the voltage differences $\Delta V\alpha$ and $\Delta V\beta$ and is less than or equal to the voltage difference $\Delta Vgth$. The voltage VGS is, for example, a voltage at which the voltage of the source line SL becomes higher than the voltage of the select gate line SGS (bias) by, for example, the voltage difference $\Delta Vg$ when the voltage of the source line SL and the select gate line SGS (bias) to which the voltage is applied are stabilized. In such a case, for example, after time T1, it can be regarded that the voltage of the source line SL is higher than the voltage of the select gate line SGS (bias) by the voltage difference $\Delta Vg$.

Accordingly, after time T1, the SL-side GIDL current is generated in the memory pillar MP of the bias block BLK (bias). In the bias block BLK (bias), the word line WL (bias) is in a floating state. For that reason, the holes generated due to the SL-side GIDL current can move in the memory pillar MP without being taken into the charge storage layer in the bias block BLK (bias).

At time T1, the control signal BLS applied to the gate of the transistor Tr1 connected to the bit line BL is set to a low level. The transistor Tr1 is in the OFF state while the low level control signal BLS is applied to the gate thereof. The voltage applied to the bit line BL controlled in this way is boosted according to the generation of the SL-side GIDL current, and is boosted to a voltage VBL. This is because the holes can move in the memory pillars as described above, and thus the voltage VERA applied to the source line SL is transferred, for example. The voltage of the bit line BL to which the voltage VBL is applied becomes lower than the voltage of the source line SL to which the voltage VERA is applied by the voltage difference $\Delta Vd$. The voltage difference ΔVd corresponds to, for example, the sum of a diode threshold voltage of the select transistor ST1 and a diode threshold voltage of the select transistor ST2 of the bias block BLK (bias). The timing at which the transistor Tr1 is turned to the OFF state is not limited to time T1.

Furthermore, at time T1, the voltage applied to the select gate line SGS (sel) is boosted to the voltage VGS similarly to the select gate line SGS (bias). In such a case, for example, after time T1, it can be regarded that the voltage of the source line SL is higher than the voltage of the select gate line SGS (sel) by the voltage difference ΔVg. The boosting of the voltage applied to the select gate line SGS (sel) is not limited to time T1.

Accordingly, after time T1, the SL-side GIDL current is generated in the memory pillar MP of the selected block BLK (sel). In the selected block BLK (sel), a low voltage such as the voltage VE is applied to the word line WL (sel). For that reason, the holes generated due to the SL-side GIDL current are taken into the charge storage layer of the memory cell transistor MT of the memory pillar MP and combined with the electrons in the charge storage layer.

After that, at time T2, the voltage applied to the select gate line SGD (sel) is boosted to the voltage VGD. The voltage VGD is higher than the voltage VE. The time T2 is a time when the voltage of the bit line BL is higher than the select gate line SGD (sel) to which the voltage VSS is applied by the voltage difference ΔVg in the process during which the voltage is applied and the voltage of the bit line BL rises as described above. The voltage VGD is, for example, a voltage at which the voltage of the bit line BL becomes higher than the voltage of the select gate line SGD (sel) by, for example, the voltage difference ΔVg when the voltages of the bit line BL and the select gate line SGD (sel) to which the voltage is applied are stabilized. In such a case, for example, after time T2, it can be regarded that the voltage of the bit line BL is higher than the voltage of the select gate line SGD (sel) by the voltage difference ΔVg. In such a case, the voltage of the select gate line SGD (sel) to which the voltage VGD is applied becomes lower than the voltage of the select gate line SGS (sel) to which the voltage VGS is applied by the voltage difference ΔVd.

Accordingly, after time T2, the BL-side GIDL current is generated in the memory pillar MP of the selected block BLK (sel). Similarly to the description of the SL-side GIDL current in the selected block BLK (sel), the holes generated due to the BL-side GIDL current are taken into the charge storage layer of the memory cell transistor MT of the memory pillar MP and combine with the electrons in the charge storage layer.

In the description as above, the example in which the voltage VGS is applied to the select gate lines SGS (bias) and SGS (sel) and the voltage VGD lower than the voltage VGS is applied to the select gate line SGD (sel) is described. However, this embodiment is not limited thereto. For example, the same voltage VGD may be applied to the select gate lines SGS (bias), SGS (sel), and SGD (sel).

In the description as above, the example in which the word line WL (bias) and the select gate line SGD (bias) in the bias block BLK (bias) are set to the floating state is described. However, this embodiment is not limited thereto. For example, any voltage may be applied to each of the word line WL (bias) and the select gate line SGD (bias) as long as a voltage that allows holes generated due to the SL-side GIDL current to move in the memory pillar MP after time T1 is applied.

In the description as above, the example in which both the SL-side GIDL current and the BL-side GIDL current are generated in the selected block BLK (sel) is described. However, this embodiment is not limited thereto. For example, the semiconductor memory device 1 may be configured to generate only the BL-side GIDL current in the selected block BLK (sel).

Furthermore, in the description as above, although the case where the GIDL current is generated due to the same voltage difference ΔVg in each of the select transistors ST1 and ST2 is described, this embodiment is not limited thereto.

3. Mechanism of GIDL Erase Operation

Figure 8:
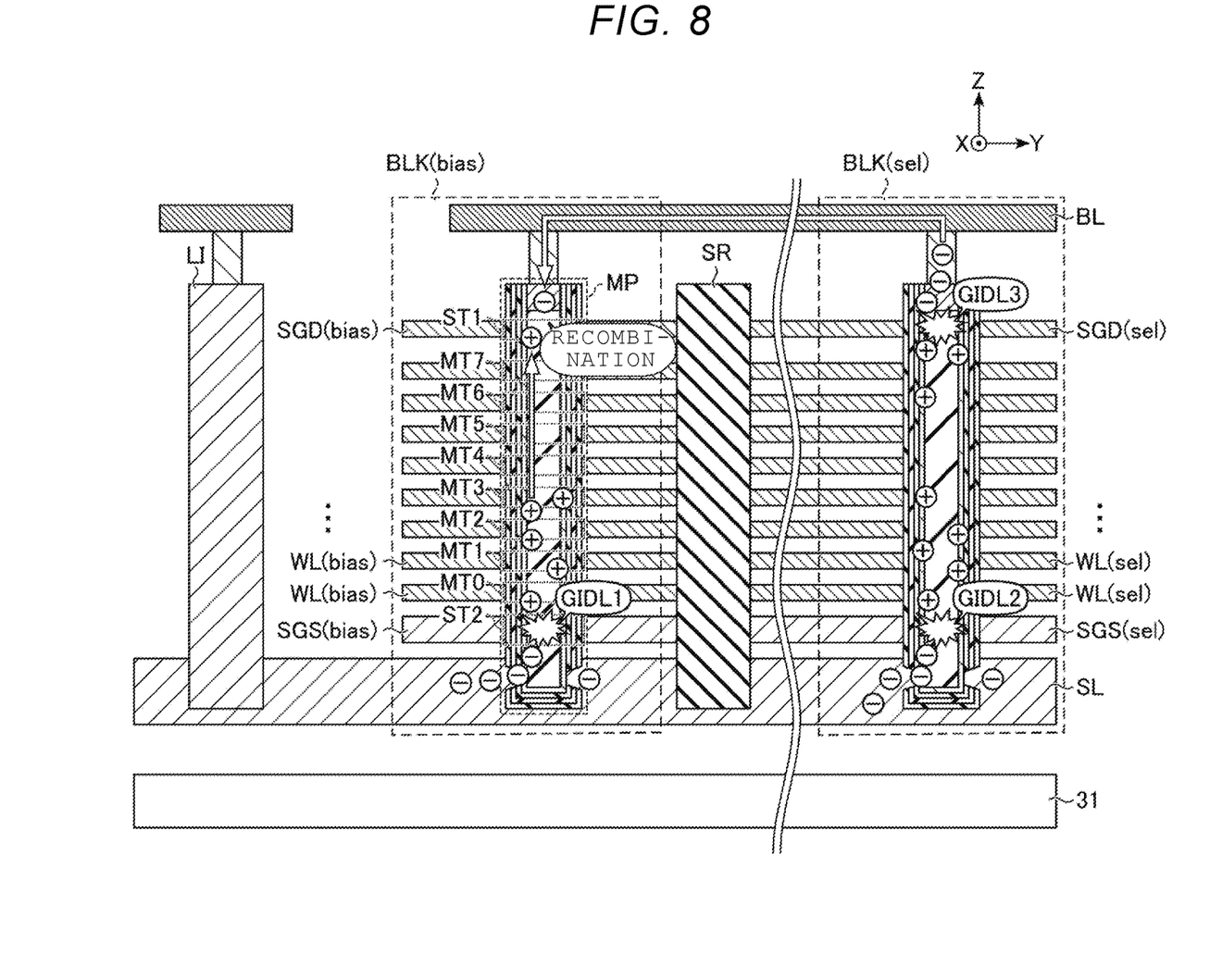
FIG. 8 is a schematic diagram for illustrating an erase operation in the semiconductor memory device according to the first embodiment.

FIG. 8 is a schematic diagram for illustrating the erase operation in the semiconductor memory device 1 according to the first embodiment. FIG. 8 corresponds to a cross-sectional structure of the semiconductor memory device 1 illustrated in FIG. 4.

In FIG. 8, a certain memory pillar MP of the bias block BLK (bias) and a certain memory pillar MP of the selected block BLK (sel) are illustrated. The erase operation corresponding to the timing chart illustrated in FIG. 7 will be described with reference to FIG. 8.

First, at time T0, the voltage VERA is applied to the source line SL. After that, at time T1, while the voltage VERA is applied to the source line SL, the voltage VGS is applied to each of the select gate lines SGS (bias) and SGS (sel).

By applying the voltage to each wiring in this way, the voltage of the source line SL becomes higher than the voltages of the select gate lines SGS (bias) and SGS (sel) by, for example, the voltage difference ΔVg.

In response to this, after time T1, the SL-side GIDL current ("GIDL1" in the figure) continues to be generated in the select transistor ST2 of the memory pillar MP of the bias block BLK (bias), and the SL-side GIDL current ("GIDL2" in the figure) also continues to be generated in the select transistor ST2 of the memory pillar MP of the selected block BLK (sel). The holes generated due these GIDL currents are respectively supplied into the memory pillars MP of the bias block BLK (bias) and the selected block BLK (sel).

The voltage VBL is applied to the bit line BL according to the generation of the SL-side GIDL current in the bias block BLK (bias). The voltage VBL is higher than the highest voltage that the sense amplifier module 12 can apply, for example. After that, at time T2, while the voltage VBL is applied to the bit line BL, and the voltage VGD is applied to the select gate line SGD (sel).

By applying the voltage to each wiring in this way, the voltage of the bit line BL becomes higher than the voltage of the select gate line SGD (sel) by, for example, the voltage difference ΔVg.

In response to this, a BL-side GIDL current ("GIDL3" in the figure) is generated in the select transistor ST1 of the memory pillar MP of the selected block BLK (sel). The holes generated due to the BL-side GIDL current are supplied into the memory pillar MP of the selected block BLK (sel). On the other hand, although electrons corresponding to the BL-side GIDL current flow into the bit line BL, the electrons are combined ("recombination" in the figure) with holes generated due to generation of the SL-side GIDL current in the bias block BLK (bias). Thus, even if electrons flow to the bit line BL, the voltage of the bit line BL is not lowered and maintained, and after time T2, the BL-side GIDL current continues to be generated in the selected block BLK (sel).

As described above, holes are continuously supplied into the memory pillars MP of the selected block BLK (sel). The supplied holes combine with the electrons in the charge storage layer of the memory cell transistor MT of the memory pillar MP. With this configuration, the threshold voltage of the memory cell transistor MT is lowered and included in the threshold voltage distribution of the "Er" state.

Effects

In the erase operation, the semiconductor memory device 1 according to the first embodiment generates the SL-side GIDL current and the BL-side GIDL current in the block BLK targeted for the erase operation. The holes generated due to these GIDL currents are supplied into the memory pillar MP of the block BLK. The supplied holes combine with the electrons in the charge storage layer of the memory cell transistor MT of the memory pillar MP. With this configuration, the threshold voltage of the memory cell transistor MT is lowered.

The semiconductor memory device 1 applies a certain voltage (hereinafter, also referred to as an erase voltage) to the bit line BL in order to generate the BL-side GIDL current and, for example, continues to apply the voltage while the erase operation is executed.

Here, when the application of the erase voltage to the bit line BL is not continued, electrons corresponding to the BL-side GIDL current may flow through the bit line BL and the voltage of the bit line BL may drop. As a result, the holes generated due to the BL-side GIDL current can flow from the inside of the memory pillar MP to the bit line BL, and/or matters that the BL-side GIDL current cannot be continuously generated during the erase operation may happen. This can lead to incomplete erasure of intended data.

The erase voltage is higher than the voltage that can be applied by the sense amplifier module 12, for example. For that reason, in order to apply the erase voltage to the bit line BL, for example, it is conceivable to provide a high breakdown voltage MOS transistor capable of transferring the erase voltage for each bit line BL. However, if the high breakdown voltage MOS transistor is provided for each bit line BL, the adverse effect on the chip size of the semiconductor memory device 1 is large.

In contrast, in the erase operation, the semiconductor memory device 1 applies the erase voltage to the bit line BL by using the bias block BLK (bias) and continues to apply the erase voltage. More specifically, the semiconductor memory device 1 generates the SL-side GIDL current in the bias block BLK (bias). The erase voltage VBL is applied to the bit line BL according to the generation of the SL-side GIDL current.

Accordingly, in the semiconductor memory device 1, it is not necessary to provide the high breakdown voltage MOS transistor for each bit line BL as described above. That is, in the semiconductor memory device 1, the number of circuit elements can be reduced. Particularly, it is possible to reduce the number of high breakdown voltage MOS transistors that occupy a relatively large area. For that reason, according to the semiconductor memory device 1, for example, it is possible to provide a semiconductor memory device with a reduced chip size and/or a reduced bit cost. Furthermore, the number of circuit elements is reduced, and thus the number of contacts between the circuit elements and the wiring is also reduced. For that reason, according to the semiconductor memory device 1, for example, it is possible to provide a semiconductor memory device in which parasitic capacitance generated between the contacts is reduced and performance is improved.

Other Embodiments

In the present specification, expressions such as "same", "identical", "constant", and "maintain" apply so long as any deviations are within design tolerances.

A case where it is described that a certain voltage is applied or supplied includes both of performing control to apply or supply the voltage and actually applying or supplying the voltage. Furthermore, applying or supplying a certain voltage may include applying or supplying a voltage of, for example, 0V.

In the present specification, "connection" refers to electrical connection, and does not exclude, for example, connection via another element between two elements.

A case where it is described that a first circuit element is disposed between a second circuit element and a third circuit element includes matters that the first circuit element has a connection relationship such that the first terminal of the first circuit element is connected to the second circuit element and the second terminal of the first circuit element is connected to the third circuit element. In this case, matters that another element is interposed between the first circuit element and the second circuit element and/or between the first circuit element and the third circuit element are not excluded.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a source line;
a bit line;
a first memory cell;
a first select transistor between the first memory cell and the source line;
a second select transistor between the first memory cell and the bit line;
a third select transistor which is between the source line and the bit line and is different from the first select transistor; and
a control circuit,
wherein the first select transistor and the third select transistor are connected to the source line, and
the control circuit is configured to, during an erase operation on the first memory cell:
apply a first voltage to the source line;
apply a second voltage lower than the first voltage to a gate of the third select transistor while applying the first voltage to the source line to cause a third voltage to be applied to the bit line; and
apply a fourth voltage lower than the third voltage to a gate of the second select transistor while the third voltage is applied to the bit line.

2. The semiconductor memory device according to claim 1, wherein the third voltage is lower than the first voltage.

3. The semiconductor memory device according to claim 2, wherein the fourth voltage is lower than the second voltage.

4. The semiconductor memory device according to claim 3, wherein the second voltage is lower than the third voltage.

5. The semiconductor memory device according to claim 4, wherein a difference between the first voltage and the third voltage is equal to a difference between the second voltage and the fourth voltage.

6. The semiconductor memory device according to claim 2, further comprising:
a fourth select transistor between the third select transistor and the bit line,
wherein a difference between the first voltage and the third voltage is based on a diode threshold voltage of the third select transistor and a diode threshold voltage of the fourth select transistor.

7. The semiconductor memory device according to claim 1, wherein the third select transistor is in a block different from a block including the first memory cell.

8. The semiconductor memory device according to claim 1, wherein, a threshold voltage of the first memory cell is lowered according to the application of the fourth voltage to the gate of the second select transistor while the third voltage is applied to the bit line.

9. The semiconductor memory device according to claim 1, wherein the control circuit is further configured to apply a fifth voltage lower than the fourth voltage to a gate of the first memory cell while the third voltage is applied to the bit line and the fourth voltage is applied to the gate of the second select transistor.

10. The semiconductor memory device according to claim 1, wherein the source line includes metal or polysilicon.

11. The semiconductor memory device according to claim 1, further comprising:
a second memory cell between the third select transistor and the bit line,
wherein the second memory cell has a threshold voltage in an erase state at the start of application of the first voltage to the source line.

12. The semiconductor memory device according to claim 1, further comprising:
a second memory cell between the third select transistor and the bit line,
wherein the control circuit is further configured to cause the gate of the second memory cell to be in a floating state while applying the first voltage to the source line and the second voltage to the gate of the third select transistor.

13. The semiconductor memory device according to claim 12, further comprising:
a fourth select transistor between the second memory cell and the bit line,
wherein the control circuit is further configured to cause the gate of the fourth select transistor to be in the floating state while applying the first voltage to the source line and the second voltage to the gate of the third select transistor.

14. The semiconductor memory device according to claim 1, wherein the control circuit is further configured to apply the second voltage to a gate of the first select transistor while the third voltage is applied to the bit line, while the fourth voltage is applied to the gate of the second select transistor, and while the first voltage is applied to the source line.

15. The semiconductor memory device according to claim 1, wherein the application of the fourth voltage to the gate of the second select transistor is started after the application of the third voltage to the bit line is started.

16. The semiconductor memory device according to claim 1, wherein the application of the second voltage to the gate of the third select transistor is started after the application of the first voltage to the source line is started.

17. The semiconductor memory device according to claim 1, wherein the control circuit is further configured to start application of the second voltage to a gate of the first select transistor at the same time the application of the second voltage to the gate of the third select transistor is started.

18. The semiconductor memory device according to claim 17, wherein the application of the second voltage to the gate of the first select transistor is started after the application of the first voltage to the source line is started.

19. The semiconductor memory device according to claim 1, further comprising:
a first wiring;
a voltage application circuit configured to apply a voltage to the first wiring; and
a first transistor connected to the bit line and the first wiring,
wherein the control circuit is further configured to turn the first transistor to an OFF state while the third voltage is applied to the bit line.

20. A method of erasing data stored in a first memory cell of a semiconductor memory device that includes a first memory block including the first memory cell, a second memory block including a second memory cell, a source line, a bit line, a first select transistor in the first memory block having a first end connected to a plurality of memory cells including the first memory cell and a second end connected to the source line, a second select transistor in the first memory block having a first end connected to the plurality of memory cells and a second end connected to the bit line, and a third select transistor in the second memory block having a first end connected to the bit line through a plurality of memory cells including the second memory cell and a second end connected to the source line, said method comprising:
applying, at a first point in time, a first voltage to the source line;
applying, at a second point in time after the first point in time, a second voltage lower than the first voltage to a gate of the third select transistor while applying the first voltage to the source line to cause a third voltage to be applied to the bit line; and
applying, at a third point in time after the second point in time, a fourth voltage lower than the third voltage to a gate of the second select transistor while the third voltage is applied to the bit line.

* * * * *